(12) United States Patent
Inami et al.

(10) Patent No.: US 9,051,967 B2
(45) Date of Patent: Jun. 9, 2015

(54) SLIDING MEMBER

(75) Inventors: Shigeru Inami, Inuyama (JP); Koji Zushi, Inuyama (JP); Yukihiko Kagohara, Inuyama (JP)

(73) Assignee: DAIDO METAL COMPANY LTD., Nagoya-Shi, Aichi-Ken (JP)

( * ) Notice: Subject to any disclaimer, the term of this patent is extended or adjusted under 35 U.S.C. 154(b) by 171 days.

(21) Appl. No.: 13/809,053

(22) PCT Filed: Jul. 7, 2011

(86) PCT No.: PCT/JP2011/065591
§ 371 (c)(1),
(2), (4) Date: Jan. 8, 2013

(87) PCT Pub. No.: WO2012/005325
PCT Pub. Date: Jan. 12, 2012

(65) Prior Publication Data
US 2013/0121628 A1 May 16, 2013

(30) Foreign Application Priority Data

Jul. 9, 2010 (JP) ................................. 2010-156682

(51) Int. Cl.
*B32B 9/00* (2006.01)
*F16C 33/00* (2006.01)
*C23C 16/26* (2006.01)
*F16C 33/12* (2006.01)

(52) U.S. Cl.
CPC ................. *F16C 33/00* (2013.01); *C23C 16/26* (2013.01); *F16C 2204/20* (2013.01); *F16C 33/127* (2013.01); *F16C 2206/04* (2013.01)

(58) Field of Classification Search
CPC .... F16C 33/00; F16C 33/127; F16C 2204/20; F16C 2206/04
USPC .......................... 428/217, 325, 336, 408, 457
See application file for complete search history.

(56) References Cited

U.S. PATENT DOCUMENTS

| | | | | |
|---|---|---|---|---|
| 4,789,607 A * | 12/1988 | Fujita et al. | ................... | 384/912 |
| 5,494,760 A | 2/1996 | Arnosti et al. | | |
| 6,722,785 B1 * | 4/2004 | Ikeo et al. | ...................... | 384/112 |
| 6,740,393 B1 * | 5/2004 | Massler et al. | .................. | 428/408 |
| 6,740,428 B2 * | 5/2004 | Norito et al. | .................. | 384/913 |
| 6,994,474 B2 * | 2/2006 | Kinno et al. | .................. | 384/492 |
| 7,322,749 B2 * | 1/2008 | Konishi et al. | .................. | 384/13 |
| 8,518,543 B2 * | 8/2013 | Kano et al. | ...................... | 428/408 |
| 2006/0099422 A1 * | 5/2006 | Gussone et al. | .............. | 428/408 |
| 2008/0063894 A1 | 3/2008 | Nakashima et al. | | |

FOREIGN PATENT DOCUMENTS

| | | | |
|---|---|---|---|
| DE | 60317026 T2 | | 8/2008 |
| EP | 0503822 | * | 9/1992 |
| JP | 59-093348 | * | 5/1984 |
| JP | 5245968 A | | 9/1993 |
| JP | 06235038 A | | 8/1994 |
| JP | 2001165167 A | | 6/2001 |
| JP | 2001-214711 | * | 8/2001 |

(Continued)

Primary Examiner — Archene Turner
(74) Attorney, Agent, or Firm — Browdy and Neimark, PLLC

(57) ABSTRACT

Slide member is provided with an Al-based bearing alloy layer including Al and Si particles, and DLC layer laminated over Al-based bearing alloy layer. At least some of the Si particles included in Al-based bearing alloy layer are exposed on DLC layer side surface.

5 Claims, 5 Drawing Sheets

(56) References Cited

FOREIGN PATENT DOCUMENTS

| JP | 2003147525 A | 5/2003 |
| JP | 200561219 A | 3/2005 |
| JP | 2007-031773 * | 2/2007 |
| JP | 2007100200 A | 4/2007 |
| JP | 2010126419 A | 6/2010 |
| WO | 2004092602 A1 | 10/2004 |
| WO | 2009/099226 * | 8/2009 |

* cited by examiner

FIG. 6A

| No. | Si Content MASS% | Si Area Ratio % | Si Region Decomposition Aspect Ratio | Si Particle Distance μm | Si Area Percentage Less than 4 μm % | Si Area Percentage 4–20 μm % | DLC Layer Hardness Hv | DLC Layer Thickness μm |
|---|---|---|---|---|---|---|---|---|
| EXAMPLE 1 | 1 | 0.5 | 4.5 | 25 | 15 | 85 | 2500 | 5 |
| EXAMPLE 2 | 1 | 0.5 | 4.5 | 25 | 15 | 85 | 2500 | 5 |
| EXAMPLE 3 | 1 | 0.5 | 4.5 | 25 | 15 | 85 | 2500 | 5 |
| EXAMPLE 4 | 15 | 15 | 3.6 | 18 | 75 | 25 | 2500 | 5 |
| EXAMPLE 5 | 2 | 1 | 4 | 20 | 85 | 15 | 2500 | 5 |
| EXAMPLE 6 | 8 | 10 | 3.2 | 16 | 15 | 85 | 2500 | 5 |
| EXAMPLE 7 | 3 | 2 | 3 | 15 | 65 | 35 | 2500 | 5 |
| EXAMPLE 8 | 3 | 2.5 | 3 | 15 | 65 | 35 | 2500 | 5 |
| EXAMPLE 9 | 3 | 2 | 3 | 15 | 65 | 35 | 2500 | 5 |
| EXAMPLE 10 | 3 | 4.5 | 3 | 15 | 65 | 35 | 2500 | 5 |
| EXAMPLE 11 | 6 | 8.5 | 2.2 | 7.5 | 40 | 60 | 2500 | 5 |
| EXAMPLE 12 | 6 | 8.5 | 2.2 | 7.5 | 60 | 40 | 2500 | 2 |
| EXAMPLE 13 | 6 | 8.5 | 2.2 | 7.5 | 20 | 80 | 7000 | 20 |
| EXAMPLE 14 | 6 | 10 | 2.2 | 7.5 | 55 | 45 | 600 | 1 |
| EXAMPLE 15 | 6 | 10 | 2.2 | 7.5 | 25 | 75 | 7000 | 20 |
| EXAMPLE 16 | 6 | 8.5 | 2.2 | 7.5 | 55 | 45 | 400 | 1 |
| EXAMPLE 17 | 6 | 8.5 | 2.2 | 7.5 | 40 | 60 | 6000 | 3 |
| EXAMPLE 18 | 6 | 8.5 | 2.2 | 7.5 | 25 | 75 | 2500 | 10 |
| EXAMPLE 19 | 6 | 8.5 | 2.2 | 7.5 | 25 | 75 | 650 | 15 |
| EXAMPLE 20 | 6 | 8.5 | 2.2 | 7.5 | 25 | 75 | 50 | 10 |
| EXAMPLE 21 | 6 | 8.5 | 2.2 | 7.5 | 40 | 60 | 500 | 10 |
| EXAMPLE 22 | 6 | 8.5 | 2.2 | 7.5 | 60 | 40 | 200 | 10 |
| COMPARATIVE EXAMPLE 1 | 0 | — | — | — | — | — | 2500 | 5 |
| COMPARATIVE EXAMPLE 2 | 6 | 8.5 | 2.2 | 7.5 | 40 | 60 | — | — |

| No. | HXT | A/T | DLC LAYER FORMATION SPEED | DELAMINATION LOAD N | SEIZURING SPECIFIC LOAD MPa |
|---|---|---|---|---|---|
| EXAMPLE 1 | 12500 | 0.10 | 1 | 100 | 18 |
| EXAMPLE 2 | 12500 | 0.10 | 2 | 100 | 18 |
| EXAMPLE 3 | 12500 | 0.10 | 3 | 100 | 18 |
| EXAMPLE 4 | 12500 | 3.00 | 2 | 110 | 19 |
| EXAMPLE 5 | 12500 | 0.20 | 2 | 110 | 19 |
| EXAMPLE 6 | 12500 | 2.00 | 2 | 115 | 20 |
| EXAMPLE 7 | 12500 | 0.40 | 2 | 130 | 22 |
| EXAMPLE 8 | 12500 | 0.90 | 2 | 140 | 23 |
| EXAMPLE 9 | 12500 | 0.40 | 2 | 130 | 23 |
| EXAMPLE 10 | 12500 | 0.90 | 2 | 140 | 24 |
| EXAMPLE 11 | 12500 | 1.70 | 2 | 160 | 25 |
| EXAMPLE 12 | 14000 | 4.25 | 2 | 150 | 24 |
| EXAMPLE 13 | 12000 | 0.43 | 2 | 150 | 23 |
| EXAMPLE 14 | 7000 | 10.00 | 2 | 160 | 26 |
| EXAMPLE 15 | 8000 | 0.50 | 2 | 160 | 26 |
| EXAMPLE 16 | 6000 | 8.50 | 2 | 170 | 27 |
| EXAMPLE 17 | 7500 | 2.83 | 2 | 180 | 28 |
| EXAMPLE 18 | 6500 | 0.85 | 2 | 180 | 28 |
| EXAMPLE 19 | 750 | 0.57 | 2 | 170 | 27 |
| EXAMPLE 20 | 5000 | 0.85 | 2 | 190 | 29 |
| EXAMPLE 21 | 2000 | 0.85 | 2 | 200 | 30 |
| EXAMPLE 22 | 600 | 0.85 | 2 | 190 | 29 |
| COMPARATIVE EXAMPLE 1 | 12500 | — | 2 | 50 | 9 |
| COMPARATIVE EXAMPLE 2 | — | — | — | — | 6 |

FIG. 6B

SLIDING MEMBER

TECHNICAL FIELD

The present invention relates to a slide member provided with a diamond-like carbon layer over a bearing alloy layer.

BACKGROUND

A slide member such as a slide bearing provided with a bearing alloy layer comprising Al alloy or Cu alloy exhibits relatively good initial conformability and outstanding fatigue resistance and wear resistance. Such slide member is employed in bearings for high output engines used, for instance, in automobile and industrial machines in general. A slide member with further improved bearing properties is desired with improvement in engine performance.

A slide member with improved bearing properties, namely conformability and wear resistance, is disclosed in JP 2001-165167 A. The disclosed slide member has a bearing alloy layer comprising Al alloy or Cu alloy which has annular protrusions formed on it. The slide member further has a diamond-like carbon layer on the surface of the annular protrusions. The document teaches that the conformability of the disclosed slide member is improved because the annular protrusions are plastic deformation prone when subjected to the load applied by the counter element. The document further teaches that the disclosed slide member exhibits good wear resistance because of the diamond like carbon layer provided on the surface of the bearing alloy layer.

In addition to improvement in conformability and wear resistance, reduced friction coefficient is emerging as a further desired improvement in bearing properties.

SUMMARY OF THE INVENTION

Problems to be Overcome

The present invention is based on the above described background and one object of the present invention is to provide a slide member with reduced fiction coefficient.

Means to Overcome the Problem

In one embodiment of the present invention, a slide member includes an Al-based bearing alloy layer including Si particles, and a DLC layer laminated over the Al-based bearing alloy layer, wherein at least some of the Si particles included in the Al-based bearing alloy layer are exposed on a DLC layer side surface.

The Al-based bearing alloy layer is Al based and includes Si particles and other components as required. Some of the Si particles within the Al-based bearing alloy layer are exposed on the DLC (Diamond-Like Carbon) surface side. It is to be appreciated that the Si particles exposed on the surface in the DLC layer side indicate Si particles that are not covered by the Al matrix. Thus, the Si particles exposed on the DLC layer side surface include the Si particles that protrude toward the DLC layer side from the DLC layer side surface of the Al-based bearing alloy layer. The Si particles exposed on the DLC layer side can be obtained through adjustments in the percentage (weight %) of Si particles contained in the Al-based bearing alloy layer and the particle diameter of the Si particles.

The Al-based bearing alloy layer may be provided over a metal backing made, for instance, of iron.

The primary component of the DLC layer is an amorphous material comprising hydrogen carbide or an allotrope of carbon. The DLC layer is formed over the Al-based bearing alloy layer by plasma enhanced chemical vapor deposition (CVD), physical vapor deposition (PVD), or the like.

In the present embodiment, the DLC layer slides with respect to the counter element on the surface in the opposite side of the Al-based bearing alloy layer. Hereinafter, the surface of the DLC layer in the opposite side of the Al-based bearing alloy layer that slides with respect to the counter element is referred to as "the slide surface of the DLC layer".

The shape of the sliding surface of the DLC layer is controlled by controlling the speed of the DLC layer formation or controlling the distribution of the Si particles residing on the DLC layer side surface of the Al-based bearing alloy layer.

The DLC layer grows in the direction of its thickness from the Si particles exposed on the DLC layer side surface of the Al-based bearing alloy layer. Thus, the DLC layer grown from the Si particles exposed on the DLC layer side surface of the Al-based bearing alloy layer reflects the planar shape of the exposed Si particles. That is, portions of the slide layer of the DLC layer that correspond to the Si particles exposed from the Al-based bearing alloy layer results in a protrusion which is protrusive as compared to other portions. Carbon constituting the DLC layer forms a stronger bond with silicon (Si), a congener of carbon, as compared to Al which is the primary component of the Al-based bearing alloy layer. Thus, the Si particles exposed from the Al-based bearing alloy layer serves as a medium to establish a stronger bond between the DLC layer and the Al-based bearing alloy layer. Further, the amount of protrusion observed on the slide surface of the DLC layer increases with the increase in the amount of protrusion of the Si particles protruding toward the DLC layer side from the Al-based bearing alloy layer.

The protrusions formed on the slide surface of the DLC layer, so as to correspond to the planar shapes of the Si particles, are prone to receive load from the counter element. Thus, frictional heat easily develops on the protrusions when the protrusions formed on the slide surface of the DLC layer is in sliding contact with the counter element. The frictional heat facilitates graphitization of the protrusions formed on the slide surface of the DLC layer and thus, the softening of the protrusions, thereby reducing the resistance to shearing force. Hence, shearing force applied to the DLC layer, when sliding with the counter element, renders the DLC layer slippery which means that the frictional coefficient of the DLC layer is reduced.

The protrusions reflecting the planar shapes of the Si particles are formed on the slide surface of the DLC layer when the DLC layer is formed at a certain speed, which is hereinafter referred to as a first formation speed.

The slide surface of the DLC layer can be shaped relatively flat by controlling the formation speed of the DLC layer or controlling the distribution of the Si particles exposed from the Al-based bearing alloy layer. The slide surface of the DLC layer, when formed relatively flat, allows the load of the counter element to be distributed throughout the slide surface of the DLC layer. The DLC layer and the Si particles are harder than Al that serves as the matrix of the Al-based bearing alloy layer.

Therefore, the DLC layer formed on the Si particles exposed from the Al-based bearing alloy layer does not easily deform when load is applied to the slide surface of the DLC layer. In contrast, the DLC layer which is formed on Al serving as the matrix of the Al-based bearing alloy layer where the Si particles are not exposed, deforms easily toward the Al-based bearing alloy layer with the deformation of Al when load is applied from the sliding surface side of the DLC layer. As a result, the load applied by the counter element is prone to concentrate on the DLC layer located on the exposed Si particles even when the load is evenly distributed throughout the sliding surface of the flat DLC layer. Further, because the DLC layer formed on the Si particles exposed from the Al-based bearing alloy layer and the counter element are prone to come in sliding contact, frictional heat readily develops at the contact site. The frictional heat facilitates graphitization and thus, the softening of the DLC layer formed on the Si particles, thereby reducing the resistance to shearing force. Hence, shearing force applied to the DLC layer, when sliding with the counter element, renders the DLC layer slippery, which means that the frictional coefficient of the DLC layer is reduced.

The slide surface of the DLC layer becomes relatively flat when the DLC layer is formed at a certain speed which is hereinafter referred to as a second formation speed.

Further, as shown in FIG. 5, the DLC layer formed on the Si particles exposed from the Al-based bearing alloy layer can be made thinner than the DLC layer formed at the second formation speed by controlling the formation speed of the DLC layer or controlling the distribution of the Si particles exposed from the Al-based bearing alloy layer. As a result, the DLC layer formed on the Si particles exposed from the Al-based bearing alloy layer can be made thinner than other portions of the DLC layer. This results in formation of recesses in the portions of the slide surface of the DLC layer corresponding to the exposed Si particles. Lubricating oil for lubricating the slide portion is fills the recess thus formed. This facilitates the lubrication between the slide member and the counter element and renders the slide member less friction prone. As a result, the requirement for improvement in seizure resistance can also be achieved.

The slide surface of the DLC layer can be recessed by forming the DLC layer at a certain speed referred to as a third formation speed.

In the slide member of one embodiment of the present invention, the Si particles exposed on the DLC layer side surface occupy an area percentage equal to or greater than 1(%) and equal to or less than 10(%).

Controlling the area percentage of the Si particles exposed on the DLC layer side surface of the Al-based bearing alloy layer in the described manner improves the adhesion of the Al-based bearing alloy layer and the DLC layer. The area percentage indicates the percentage that the projection area of the Si particles exposed toward the DLC layer side from the Al-based bearing alloy layer, i.e. the area of the planar shape of the Si particles, occupies within the total area of the DLC layer side surface of the Al-based bearing alloy layer. When the area percentage of the Si particles is less than 1(%), the Si particles becomes less effective in the bonding between the Al-based bearing alloy layer and the DLC layer. Further, when the area percentage of the Si particles is less than 1(%), the convexes and concaves formed on the slide surface of the DLC layer, reflecting the shapes of the Si particles, are also reduced.

As a result, the contribution of the Si particles in reducing friction becomes smaller. In contrast, when the area percentage of the Si particles is increased, the contribution of the Si particles on the bonding between the Al-based bearing alloy layer and the DLC layer is increased. However, from the wear resistance standpoint, the area percentage of the Si particles is preferably controlled to 10% or less. The area percentage of the Si particles exposed toward the DLC layer side is controlled to 1% or greater and 10% or less for the above described reasons.

The area percentage of the Si particles mentioned in this specification indicates the sum of the projection area of every Si particle residing within the unit area of the DLC layer side surface of the Al-based bearing alloy layer.

In the slide member of one embodiment of the present invention, the Si particles exposed on the DLC layer side surface have an aspect ratio, obtained by a region decomposition method, equal to or less than 3 and are spaced from one another by a distance equal to or less than 15 (μm). By controlling the aspect ratio, obtained by the region decomposition method, of the Si particles exposed on the DLC layer side surface of the Al-based bearing alloy layer and controlling the distance between the Si particles, the Si particles are evenly distributed on the DLC layer side surface of the Al-based bearing alloy layer. This further improves the bonding between the Al-based bearing alloy layer and the DLC layer. The even distribution of the Si particles further results in the even distribution of convexes and concaves on the sliding surface of the DLC layer. Thus, friction with the counter element is reduced especially during startup. Seizure resistance can therefore be improved more effectively.

The aspect ratio of Voronoi polygons derived from the region decomposition method will be described hereinafter. The region decomposition method employed in the present invention draws imaginary lines between the adjacent Si particles residing on the DLC layer side surface of the Al-based bearing alloy layer to derive Voronoi polygons containing the Si particles. This determines the region occupied by a single Si particle, in other words, the region surrounded by the drawn imaginary lines. The area of the region surrounded by the imaginary lines is obtained by statistical calculation to allow quantitative evaluation of the area of decomposed regions. The projection area of the exposed Si particles and the count of the exposed Si particles show a correlation when the content of the Si particles is constant. More specifically, the count of the exposed Si particles become smaller as the projection area of the exposed Si particles become greater, thereby increasing the area of the decomposed region, in other words, the average of area of the region that a single Si particle occupies. In contrast, the count of the exposed Si particles become greater as the projection area of the exposed Si particles become smaller, thereby decreasing the average of area of the decomposed regions. Accordingly, the projection area of the exposed Si particles can be obtained quantitatively by the size of the area of the decomposed regions. The ratio of major axis to minor axis of the occupied regions which was decomposed in the above manner indicates the aspect ratio of Voronoi polygons derived by the region decomposition method.

In the slide member of one embodiment of the present invention, the Al-based bearing alloy layer includes 1.5 to 8 (mass %) of the Si particles and a balance consisting substantially of Al, and among the Si particles exposed on the DLC layer side surface, an area of the Si particles having a particle diameter less than 4 (μm) occupies 20(%) to 60(%) of the total area of the DLC layer side surface, whereas an area of the Si particles having a particle diameter ranging from 4 (μm) to 20 (μm) occupies 40(%) or more of the total area of the DLC layer side surface.

The Al-based bearing alloy layer preferably includes Si particles ranging from 1.5 to 8 (mass %) and a balance consisting substantially of Al. By configuring the content of Si particles to 1.5 (mass %) or greater, the Si particles become exposed on the DLC layer side surface of the Al-based bearing alloy layer. On the other hand, by configuring the content of Si particles to 8 (mass %) or less, the Al-based bearing alloy layer does not become excessively hard and thus, achieves improvement in fatigue resistance.

Further, among the Si particles exposed on the DLC layer side surface of the Al-based bearing alloy layer, an area of the Si particles having a particle diameter less than 4 (μm) preferably occupies 20 to 60(%) of the total area of the DLC layer side surface, whereas an area of the Si particles having a particle diameter ranging from 4 (μm) to 20 (μm) preferably occupies 40(%) or more of the total area of the DLC layer side surface. When the particle diameter and the area percentage of the Si particles fall within the described ranges, the area of the slide surface of the DLC layer being graphitized becomes optimal. The graphitization of the sliding surface of the DLC layer thus, progresses in optimal amount. This results in reduced friction coefficient of the DLC layer and improved wear resistance. Further, outstanding adhesion is achieved between the DLC layer and the Al-based bearing alloy layer which in turn improves the seizure resistance.

The total area of the Si particles exposed on the DLC layer side surface of the Al-based bearing alloy layer can be controlled by modifying the particle diameter of the Si particles.

The analysis on the area percentage of the Si particles is done by capturing images of the DLC layer side surface of the Al-based bearing alloy layer with a microscope and putting the captured images through an image analysis equipment. In doing so, every Si particle residing within the observation field of, for instance, 0.0125 mm² is extracted and the area is calculated for each of the extracted Si particles. The area percentage is calculated based on the ratio of the area of the observation field to the sum of the area of the Si particles. The area percentage that the total area of the Si particles residing within the observation field occupies within the area of the observation field is equal to the area percentage that the total area of the Si particles exposed on the DLC layer side surface of the Al-based bearing alloy layer occupies within the area of the DLC layer side surface of the Al-based bearing alloy layer. The area percentage may be configured to vary in certain locations depending upon usage. In obtaining the particle diameter of the Si particles exposed on the DLC layer side surface of the Al-based bearing alloy layer, the area of each Si particle residing within the 0.0125 mm² observation field is measured. Then, an imaginary circle is drawn which has an area identical to the measured area of the Si particle and the diameter of the imaginary circle is converted into the particle diameter.

In the slide member of one embodiment of the present invention, $A \geq 0.5 \times T$, where A (%) represents the area percentage of the Si particles exposed on the DLC layer side surface of the Al-based bearing alloy layer and T (μm) represents the thickness of the DLC layer.

Area percentage A (%) of the Si particles and thickness T (μm) of the DLC layer affect the friction produced in the sliding movement. More specifically, it becomes easier to cause shear slips within the DLC layer when a DLC layer, having a certain Si particle area percentage, becomes thinner or when the Si particle area becomes greater in a DLC layer having a certain thickness, thereby facilitating the reduction of the friction coefficient. Area percentage A (%) of the Si particles exposed on the DLC layer side surface and thickness T (μm) of the DLC layer are interrelated in the above described manner.

In the slide member of one embodiment of the present invention, $H \leq 10000/T$ and $T \leq 20$, where H (HV) represents the hardness of the DLC layer and T (μm) represents the thickness of the DLC layer.

The influence of the Si particles in causing the above described difference in the hardness of the DLC layer becomes greater when $H \leq 10000/T$ and $T \leq 20$, where H (HV) represents the hardness of the DLC layer and T (μm) represents the thickness of the DLC layer. When the thickness of the DLC layer to the hardness of the DLC layer is controlled in the above described range, it becomes easier to effectively facilitate the graphitization of the exceptionally wear-resistant slide surface of the DLC layer based on the presence/absence of the hard particles. The controlled correlation between the hardness and the thickness of the DLC layer achieves both reduction in friction coefficient and improvement in wear resistance.

In the slide member of one embodiment of the present invention, the DLC layer satisfies $H \leq 6000$, and $T \leq 15$. This means that hardness H of the DLC layer is $H \leq 6000$ (HV) and thickness T of the DLC layer is $T \leq 15$ (μm).

When the thickness of the DLC layer is equal to or less than 15 (μm), it becomes easier to form, on the slide surface of the DLC layer, convexes and concaves that reflect the Si particles exposed from the Al-based bearing alloy layer. The above described thickness of the DLC layer is obtained by controlling the duration of methodologies such as plasma enhanced CVD and PVD employed in forming the DLC layer.

Further, when hardness H of the DLC layer is equal to or less than 6000 (HV), the aggression of the DLC layer on the counter element can be readily suppressed while achieving sufficient wear resistance. The hardness of the DLC layer may be modified through adjustments in the content of additive elements such as hydrogen, Si, Ti, and W in the DLC layer and the ratio of hybrid orbital ($sp^2/sp^3$) in the DLC layer.

In the slide member of one embodiment of the present invention, the hardness of the DLC layer is 1.1 times or greater the hardness of the Al-based bearing alloy layer and 0.9 times or less the hardness of the counter element with which the DLC layer slides.

When the hardness of the DLC layer is 1.1 times or greater the hardness of the Al-based bearing alloy layer, the DLC layer exerts its wear resistance more effectively.

On the other hand, when the hardness of the DLC layer is 0.9 times or less the hardness of the counter element with which it slides, the wear of the counter element can be suppressed more reliably. Thus, specifying the hardness of the DLC layer in the above described manner reduces the wear of both the DLC layer and the counter element.

Between the Al-based bearing alloy layer and the DLC layer, an intermediate layer may be provided to improve the bonding between them. The intermediate layer preferably comprises metal such as Si, Ti, Cr, and W or carbides and nitrides. The intermediate layer may vary its composition in the thickness direction. For instance, when the intermediate layer is a Si—C system or a Ti—C system, the concentration of Si or Ti may be arranged to be relatively higher in the Al-based bearing alloy layer side, whereas the concentration of C may be arranged to be relatively higher in the DLC layer side.

BRIEF DESCRIPTION OF THE DRAWINGS

FIGS. 6A and 6B A chart specifying EXAMPLES and COMPARATIVE EXAMPLES of a slide member of one embodiment.

EMBODIMENTS OF THE INVENTION

Figure 1:
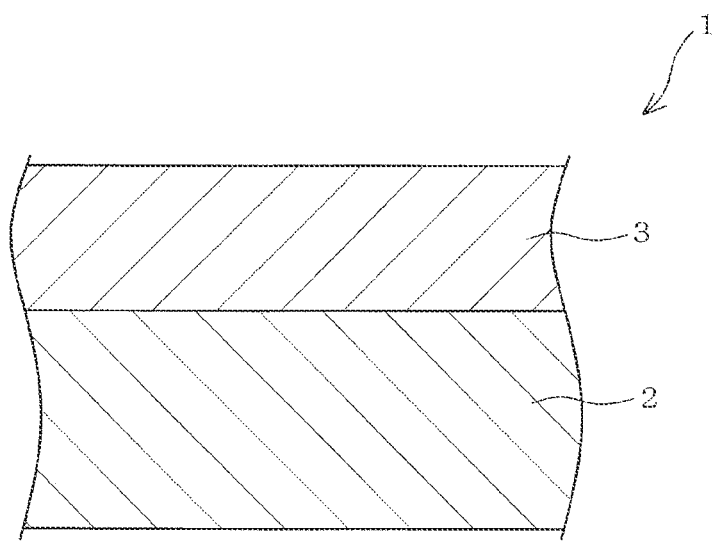
FIG. 1 A cross sectional view schematically indicating a slide member of one embodiment of the present invention.
Figure 2:
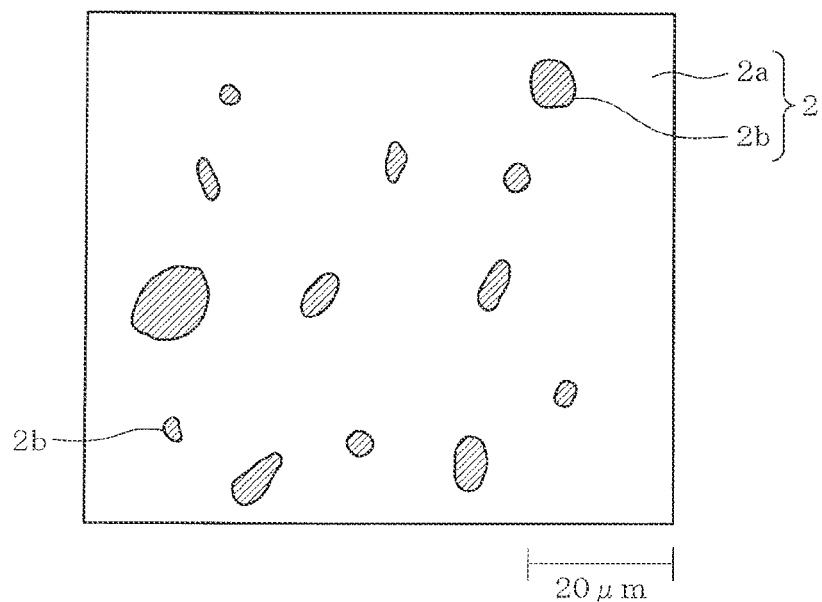
FIG. 2 A transverse plan view schematically indicating a slide surface of an Al-based bearing alloy layer of a slide member of one embodiment.

The slide member of the present embodiment is illustrated in FIG. 1. Slide member 1 shown in FIG. 1 is provided with Al-based bearing alloy layer 2 and DLC layer 3. Al-based bearing alloy layer 2 is provided over a metal backing not shown. DLC layer 3 is provided over Al-based bearing alloy layer 2. As shown in FIG. 2, Al-based bearing alloy layer 2 comprises Al matrix 2a and Si particles 2b. In other words, Al-based bearing alloy layer 2 contains Si particles 2b within Al matrix 2a. Si particles 2b contained in Al-based bearing alloy layer 2 are at least partially exposed on DLC layer 3 side surface of Al-based bearing alloy layer 2. Being "exposed" in this context indicates either the state in which Si particles 2b are located on a plane coincidental with DLC layer 3 side surface of Al-based bearing alloy layer 2 or the state in which Si particles 2b protrude toward DLC layer 3 from the surface.

Figure 3:
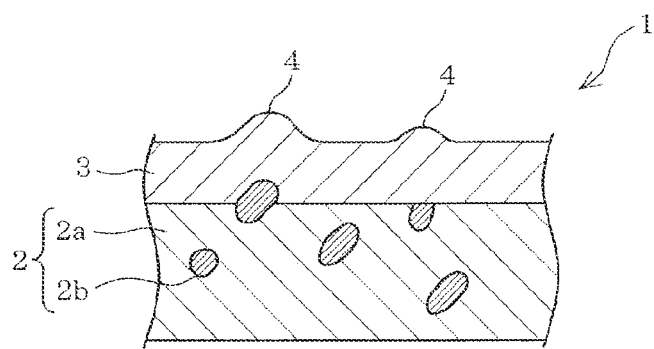
FIG. 3 A cross sectional view schematically indicating a slide member in which a DLC layer is formed at a first formation speed.

When DLC layer 3 is formed at the first formation speed, DLC layer 3 is shaped as shown in FIG. 3. That is, the slide surface of DLC layer 3 forms protrusions 4 reflecting the shapes of Si particles 2b exposed on DLC layer 3 side surface of Al-based bearing alloy layer 2.

Figure 4:
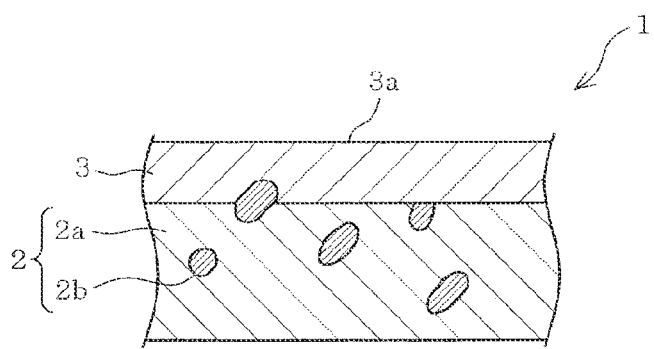
FIG. 4 A cross sectional view schematically indicating a slide member in which the DLC layer is formed at a second formation speed.

When DLC layer 3 is formed at the second formation speed, DLC layer 3 is shaped as shown in FIG. 4. That is, the slide surface of DLC layer 3 forms planar surface 3a regardless of the shapes of Si particles 2b exposed on DLC layer 3 side surface of the Al-based bearing alloy layer 2.

Figure 5:
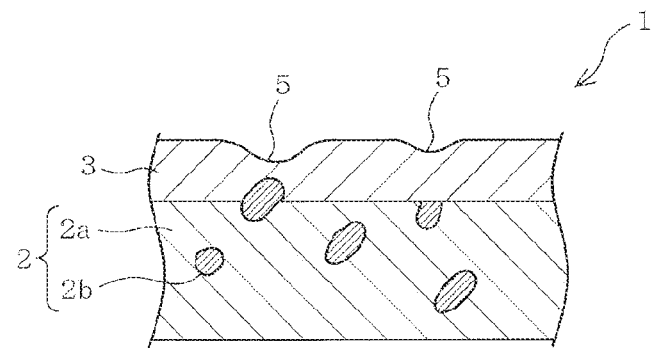
FIG. 5 A cross sectional view schematically indicating a slide member in which the DLC layer is formed at a third formation speed.

When DLC layer 3 is formed at the third formation speed, DLC layer 3 is shaped as shown in FIG. 5. That is, the slide surface of DLC layer 3 forms recesses 5 reflecting the shapes of Si particles 2b exposed on the DLC layer 3 side surface of Al-based bearing alloy layer 2.

Next, a description is given on a method of manufacturing a slide member of the present embodiment.

First, a sheet of Al-based bearing alloy was formed by adding a predetermined amount of Si to a melted Al and thereafter subjecting it to continuous casting. At this instance, the Al-based bearing alloy sheet was formed into a thickness of 15 mm.

Then, the Al-based bearing alloy sheet, having been subjected to continuous casting, was continuously cold rolled to a thickness of 6 mm. By controlling the continuous casting and the later described roll bonding to control the rolling reduction, a mixture of Si particles with varying particle diameter was obtained which was mixed in a predetermined percentage. The continuously rolled Al-based bearing alloy sheet was annealed to eliminate strain and stabilize the additive elements.

Then, the annealed Al-based bearing alloy sheet was roll bonded with a thin sheet of Al which is later formed into a bonding layer and was further roll bonded with a sheet of metal backing over the thin sheet. Thus, the Al-based bearing alloy sheet and the metal backing form the so called bimetal. Then, the roll bonded Al-based bearing sheet and the metal backing were annealed to eliminate strain while also improving the bonding force exerted therebetween. The annealed Al-based bearing alloy sheet and the metal backing may be further subjected to solid solution treatment, water cooled, and thereafter aged as required in order to increase their structural strength. The bimetal of the Al-based bearing alloy sheet and the metal backing, having been treated as described above, was formed into a semi cylindrical shape.

The bimetal formed into a semi cylindrical shape was further formed into a DLC layer by treating its inner peripheral surface with an ordinary plasma enhanced CVD or PVD.

Samples of a slide member were fabricated in the above described manner and verified for their friction coefficient.

More specifically, EXAMPLES obtained by the manufacturing method of the present embodiment may form the DLC layer at various controlled speeds. When the DLC layer is formed at the first formation speed, protrusions can be formed on the sliding surfaces of the DLC layer. When the DLC layer is formed at the second formation speed, a relatively flat slide surface can be obtained. When the DLC layer is formed at the third formation speed, recesses can be formed on the sliding surface of the DLC layer. Among EXAMPLES indicated in FIG. 6, EXAMPLE 1 forms the DLC layer at the first formation speed as shown in FIG. 3. EXAMPLE 2 forms the DLC layer at the second formation speed as shown in FIG. 4. EXAMPLE 3 forms the DLC layer at the third formation speed as shown in FIG. 5. Further, EXAMPLES 4 to 22 and COMPARATIVE EXAMPLE 1 each forms the DLC layer at the second formation speed. COMPARATIVE EXAMPLE 1 used for comparison in the verification does not contain Si in the Al-based bearing alloy layer. COMPARATIVE EXAMPLE 2 is not provided with a DLC layer.

Description will be given hereinafter on EXAMPLES and COMPARATIVE EXAMPLES based on FIG. 6.

(Regarding Si Content)

EXAMPLES 1 to 22 and COMPARATIVE EXAMPLE 2 include 1 to 15 (mass %) of Si within the Al-based bearing alloy layer. As opposed to this, COMPARATIVE EXAMPLE 1 does not contain Si within the Al-based bearing alloy layer.

(Regarding Area Percentage of Si Particles)

In EXAMPLES 4 to 22 and COMPARATIVE EXAMPLE 2, the area percentage of the Si particles exposed on the DLC layer side surface of the Al-based bearing alloy layer is configured to range from 1 to 10(%). In contrast, the area percentage of EXAMPLES 1 to 3 are configured to 0.5(%). Further, because COMPARATIVE EXAMPLE 1 does not contain Si, the Si particles are not exposed on the DLC layer side surface of the Al-based bearing alloy layer.

(Regarding Aspect Ratio of Si Particles by Region Decomposition Method)

In EXAMPLES 7 to 22 and COMPARATIVE EXAMPLE 2, the aspect ratio of the Voronoi polygons derived by the region decomposition method for the Si particles exposed on the DLC layer side surface of the Al-based bearing alloy layer is configured to 3 or less. As opposed to this, the aspect ratio of the Si particles in EXAMPLES 1 to 3 is configured to 4.5. Further, the aspect ratio of the Si particles in EXAMPLE 4 is configured to 3.6, the aspect ratio of the Si particles in EXAMPLE 5 is configured to 4, and the aspect ratio of the Si particles in EXAMPLE 6 is configured to 3.2.

(Regarding Distance Between Si Particles)

In EXAMPLES 7 to 22 and COMPARATIVE EXAMPLE 2, the distance between the Si particles exposed on the DLC layer side surface of the Al-based bearing alloy layer is configured to 15 (μm) or less. As opposed to this, the distance between the Si particles in EXAMPLES 1 to 3 is configured to 25 (μm). Further, the distance between the Si particles in EXAMPLE 4 is configured to 18 (μm), the distance between the Si particles in EXAMPLE 5 is configured to 20 (μm), and the distance between the Si particles in EXAMPLE 6 is configured to 16 (μm).

(Regarding Particle Diameter and Area Percentage of Si Particles)

In EXAMPLES 11 to 22 and COMPARATIVE EXAMPLE 2, the area percentage of the Si particles having particle diameter less than 4 (μm) ranges from 20 to 60(%), and the area percentage of the Si particles having particle diameter ranging from 4 to 20 (μm) is 40(%) or greater. As opposed to this, in EXAMPLES 1 to 3 and 6, though the area percentage of the Si particles having particle diameter less than 4 (μm) is 15(%), the area percentage of the Si particles having particle diameter ranging from 4 to 20 (μm) is 80(%). Similarly, in EXAMPLES 4, 5, and 7 to 10, the area percentage of the Si particles having particle diameter less than 4 (μm) is 65(%) or greater and the area percentage of the Si particles having particle diameter ranging from 4 to 20 (μm) is 35(%) or less.

(Regarding Relation Between Hardness and Thickness of DLC Layer)

Figure 7:
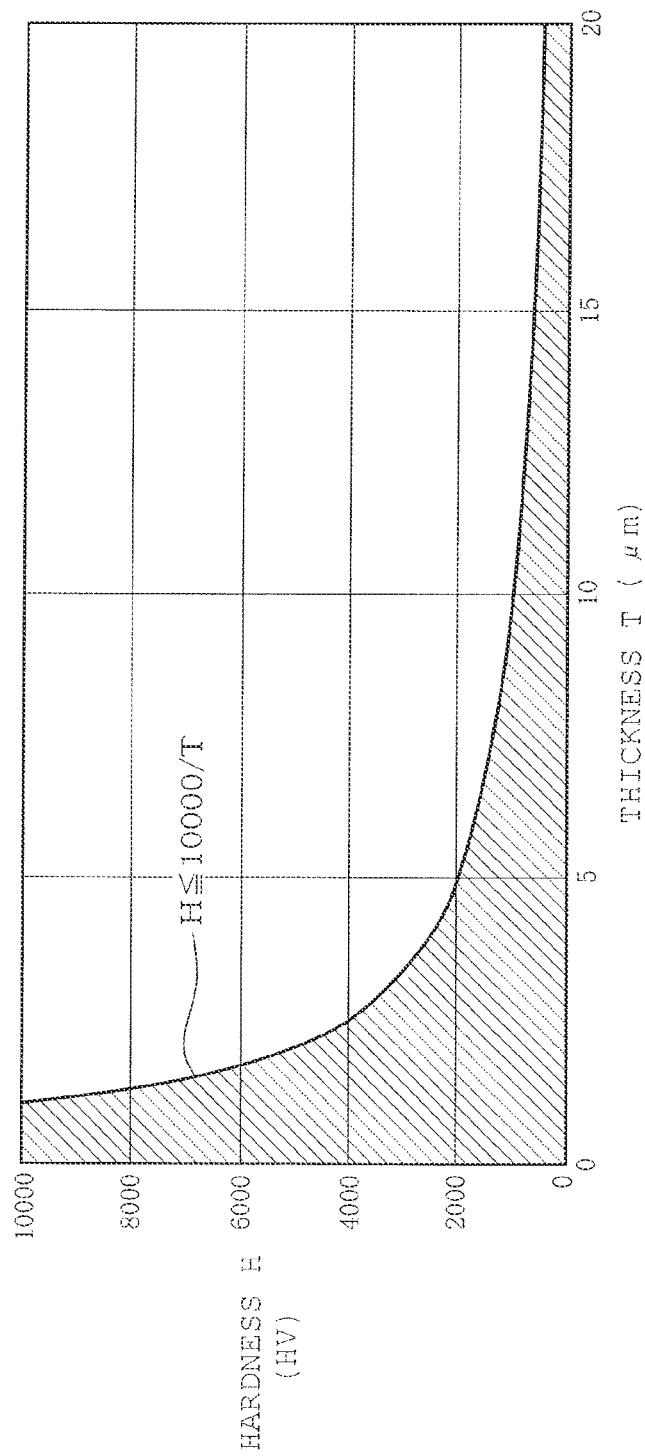
FIG. 7 A chart indicating the relation between the hardness and the thickness of the DLC layer.

In EXAMPLES 14 to 22, the relation between hardness H (HV) and thickness T (μm) of DLC satisfy H≤10000/T, and T≤20. As opposed to this, H>10000/T in EXAMPLES 1 to 13. Further, COMPARATIVE EXAMPLE 2 is not provided with a DLC layer. Still further, COMPARATIVE EXAMPLE 1 is provided with a DLC layer but H>10000/T. Hardness H and thickness T relate to one another as shown in FIG. 7. EXAMPLES 14 to 22 are plotted in the shaded region located closer to the origin from the curve derived from H≤10000/T.

(Regarding Relation Between Area Percentage of Si Particles and Thickness of DLC Layer)

In EXAMPLES 4, 6, 8, 10 to 12, and 14 to 22, area percentage A (%) of the Si particles exposed on the DLC layer side surface of the Al-based bearing alloy layer and thickness T of the DLC layer satisfies A≥0.5×T. As opposed to this, in EXAMPLES 1 to 3, 5, 7, and 13, A<0.5×T.

(Regarding Adhesion Test)

EXAMPLES 1 to 22, and COMPARATIVE EXAMPLE 1 in FIG. 6 were tested for the adhesion of the Al-based bearing alloy layer and the DLC layer. The adhesion of the DLC layer was tested by peeling the DLC layer through application of delamination load. More specifically, the DLC layer was subjected to continuous delamination load ranging from 0 (N) to 200 (N). The distance of movement during the application of the delamination load is configured to 10 (mm). The delamination load is given by a spherical element and is made of chrome steel (SUJ-2) which is 3 mm in diameter. Further, when applying the delamination load, 10 (μ liters) of lubricating oil was supplied between the slide member and the spherical element.

The delamination load in which delamination was observed in the DLC layer of each sample is as indicated in FIG. 6. The results show that the delamination load in EXAMPLES 1 to 22 were equal to or greater than 100 (N). In contrast, COMPARATIVE EXAMPLE 1 exhibit a delamination load of 50 (N). It can be understood from above that in EXAMPLES 1 to 22 of the present embodiment in which the Si particles are exposed on the DLC layer side surface of the Al-based bearing alloy layer, the DLC layer is highly adhesive. In other words, it is clear that the Si particles exposed on the DLC layer side surface of the Al-based bearing alloy layer is a contributing factor in improving the bonding between the DLC layer and the Al-based bearing alloy layer.

EXAMPLES 4 to 22 in which the area percentage of the exposed Si particles is controlled to 1% or greater show higher adhesion as compared to EXAMPLES 1 to 3. EXAMPLES 7 to 22 in which the aspect ratio of the exposed Si particles and the distance between the exposed Si particles are controlled show improved adhesion in the DLC layer as compared to EXAMPLES 1 to 6. Further, EXAMPLES 11 to 22 in which the particle diameter and the area percentage of the Si particles are controlled to take a predetermined relation exhibit improved adhesion in the DLC layer as compared to EXAMPLES 1 to 10.

(Regarding Seizure Test)

EXAMPLES 1 to 22 and COMPARATIVE EXAMPLES 1 and 2 were tested for their seizure resistance. Based on the standpoint that seizure resistance can be improved by reducing friction, reduction of friction coefficient was verified. Seizure resistance was tested under the following conditions. The sample being tested was spun at the speed of 2 (m/sec) relative to the counter shaft and was subjected to a test load of 1 (MPa/5 min). The lubricating oil applied to the sample was SAE#30 which was supplied in the amount of 20 (ml/min) at the temperature of 60° C. The counter shaft was made of carbon steel (S55C) which possessed a hardness of 600 (HV).

The specific load (MPa) in which seizure was observed in the sample is indicated in FIG. 6. Seizure was deemed to have occurred in the samples when the temperature of the surface on the backside, that is, the opposite side of the slide surface exceeded 200 (° C.), or when the frictional force produced between the sample and the counter shaft exceeded 50 (N). According to FIG. 6, the specific load in which seizure was observed in EXAMPLES 1 to 22 was equal to or greater than 18 (MPa). In contrast, the specific load in which seizure was observed in COMPARATIVE EXAMPLES 1 and 2 was equal to or less than 9 (MPa). This is an indication that EXAMPLES 1 to 22 in which the DLC layer was formed above the DLC layer side surface of the Al-based bearing alloy layer on which the Si particles were exposed showed relatively greater seizuring specific load, in other words, higher seizure resistance, which in turn is an indication of relatively small friction coefficient. Especially EXAMPLES 14 to 22, in which the thickness and the hardness of the DLC layer were controlled to a specific range, showed improved seizure resistance as compared to EXAMPLES 1 to 13. Further, EXAMPLES 4, 6, 8, 10 to 12, and 14 to 22, in which the area percentage of the Si particles exposed on the DLC layer side surface of the Al-based bearing alloy layer and the thickness of the DLC layer was controlled to a predetermined relation, showed improved seizure resistance as compared to EXAMPLES prepared in approximating conditions.

In EXAMPLES 1 to 8, 11 to 22, and COMPARATIVE EXAMPLES 1 and 2 shown in FIG. 6, the counter shaft sliding with the samples were made of carbon steel (S55C) having a slide portion exhibiting a hardness of 600 (HV). As opposed to this, in EXAMPLES 9 and 10, the counter shaft had a DLC layer coated over the slide surface of the carbon steel (S55C) and the hardness of the slide portion measured 3000 (HV). Comparison of EXAMPLES 7 and 9 shows that seizuring specific load is relatively improved in EXAMPLE 9 as compared to EXAMPLE 7. That is, in EXAMPLE 9, the hardness of the DLC layer is 0.9 times or less the hardness of the slide surface of the counter shaft. Thus, EXAMPLE 9 produces less abrasion powder as compared to EXAMPLE 7 and thereby exhibiting improved seizuring specific load. Among EXAMPLES 8 and 10 which share identical conditions except for the counter element, EXAMPLE 10 which is provided with DLC layer having a hardness equal to or less than 0.9 times of the hardness of the slide surface of the counter shaft showed improved seizuring specific load as compared to EXAMPLE 8.

(Effect of Formation Speed of DLC Layer)

EXAMPLES 1, 2, and 3 indicated in FIG. 6 form the DLC layer at different speeds. More specifically, EXAMPLE 1 forms the DLC layer shown in FIG. 3 at the first formation speed, EXAMPLE 2 forms the DLC layer shown in FIG. 4 at the second formation speed, and EXAMPLE 3 forms the DLC layer shown in FIG. 5 at the third formation speed. Further, EXAMPLES 1 to 3 have identical properties such as the Si content and the area percentage of the Si particles. However, EXAMPLES 1 to 3 do not differ significantly in delamination load and seizuring specific load. This is an indication that influence of the formation speed of the DLC layer on delamination load and seizuring specific load is small. Because the influence of the formation speed of the DLC layer on the properties of the slide member is small, EXAMPLES 4 to 22 and COMPARATIVE EXAMPLE 1 are configured to form the DLC layer at the second formation speed.

(Effect of the Examples)

By forming a DLC layer on the Al-based bearing alloy layer, EXAMPLES 1 to 22 described above allow reduction in the friction coefficient measured when sliding with the counter shaft. EXAMPLES 1 to 22 showed relatively higher bonding force between the Al-based bearing alloy layer and the DLC layer as compared to COMPARATIVE EXAMPLES 1 and 2, thereby improving the seizure resistance and reducing friction at the same time.

The present embodiment may be implemented after modifications within the scope of its spirit. Though not described, each of the components may include inevitable impurities.

What is claimed is:

1. A slide member comprising:

an Al-based bearing alloy layer primarily comprising Al and including Si particles; and wherein the Al-based bearing alloy layer includes 1.5 mass (%) or more of Si particles and a balance consisting substantially of Al;

a DLC layer laminated over the Al-based bearing alloy layer; wherein at least some of the Si particles included in the Al-based bearing alloy layer are exposed on a DLC layer side surface, and wherein the Si particles exposed on the DLC layer side surface occupy a total area percentage equal to or greater than 1(%) and equal to or less than 10(%), and wherein among the Si particles exposed on the DLC layer side surface, an area of Si particles having a particle diameter less than 4 (μm) occupies 20(%) to 60(%) of a total area of the Si particles exposed on the DLC layer side surface, whereas an area of Si particles having a particle diameter ranging from 4 (μm) to 20 (μm) occupies 40(%) or more of the total area of the Si particles exposed on the DLC layer side surface, and wherein $A \geq 0.5 \times T$, where A (%) represents the total area percentage of the Si particles exposed on the DLC layer side surface of the Al-based bearing alloy layer and T (μm) represents a thickness of the DLC layer.

2. The slide member according to claim 1, wherein the Si particles exposed on the DLC layer side surface have an aspect ratio, obtained by a region decomposition method, equal to or less than 3 and are spaced from one another by a distance equal to or less than 15(μm).

3. The slide member according to claim 1, wherein $H \leq 10000/T$ and $T \leq 20$, where H (HV) represents a hardness of the DLC layer and T (μm) represents a thickness of the DLC layer.

4. The slide member according to claim 3, wherein the DLC layer satisfies $H \leq 6000$, and $T \leq 15$.

5. The slide member according to claim 1, wherein a hardness of the DLC layer is 1.1 times or greater a hardness of the Al-based bearing alloy layer and 0.9 times or less a hardness of a counter element with which the DLC layer slides.

* * * * *